US011295801B1

(12) United States Patent
Chiang

(10) Patent No.: US 11,295,801 B1
(45) Date of Patent: Apr. 5, 2022

(54) METHOD FOR MANAGING FLASH MEMORY MODULE AND ASSOCIATED FLASH MEMORY CONTROLLER AND MEMORY DEVICE

(71) Applicant: Silicon Motion, Inc., Hsinchu County (TW)

(72) Inventor: Tsung-Yao Chiang, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 17/026,331

(22) Filed: Sep. 21, 2020

(51) Int. Cl.
*G11C 11/40* (2006.01)
*G11C 11/406* (2006.01)
*G11C 11/409* (2006.01)
*G11C 11/4076* (2006.01)
*G11C 11/4072* (2006.01)

(52) U.S. Cl.
CPC ...... *G11C 11/40622* (2013.01); *G11C 11/409* (2013.01); *G11C 11/4072* (2013.01); *G11C 11/4076* (2013.01); *G11C 11/40615* (2013.01)

(58) Field of Classification Search
CPC .......... G11C 11/40622; G11C 11/4076; G11C 11/40615; G11C 11/409; G11C 11/4072
See application file for complete search history.

(56) References Cited

U.S. PATENT DOCUMENTS 10,892,024 B2 * 1/2021 Vashi ................... G11C 11/5642
2020/0192791 A1 * 6/2020 Yang ................... G11C 16/3431
2020/0393973 A1 * 12/2020 Reusswig ............. G06F 3/0679

FOREIGN PATENT DOCUMENTS

| CN | 102460564 B | 2/2015 |
|---|---|---|
| TW | I288327 | 10/2007 |
| TW | M441187 U1 | 11/2012 |
| TW | I638359 B | 10/2018 |
| WO | 2013/145024 A1 | 10/2013 |

OTHER PUBLICATIONS

M. L. Chiang, R. C. Chang, "Cleaning policies in mo bile computers using flash memory", Journal of Systems and Software,vol. 48,Issue 3•Nov. 1, 1999 •pp. 213-231•https://doi.org/10.1016/S0164-1212(99)00059-X (Year: 1999).*

* cited by examiner

*Primary Examiner* — Ajay Ojha
(74) *Attorney, Agent, or Firm* — Winston Hsu

(57) ABSTRACT

The present invention provides a method for managing a flash memory module, wherein the method includes the steps of: grouping a plurality of blocks within the flash memory module into a plurality of groups; scanning a target block of each group, without scanning all of the blocks within the group, to determine if at least a portion of blocks of the group needs to be refreshed, wherein the group that is determined that at least the portion of blocks needs to be refreshed is marked as a marked group; only scanning at least the portion of blocks of the marked group, without scanning the groups that is not marked, to determine which block needs to be refreshed, wherein the block that is determined to be refreshed is marked as a marked block; refreshing the marked block(s) by moving valid data of the marked block(s) to at least one blank block.

13 Claims, 7 Drawing Sheets

METHOD FOR MANAGING FLASH MEMORY MODULE AND ASSOCIATED FLASH MEMORY CONTROLLER AND MEMORY DEVICE

BACKGROUND OF THE INVENTION

1. Field of the Invention

The present invention relates to flash memory.

2. Description of the Prior Art

In a flash memory module, when data stored in a block for a long time, the data may suffer a retention issue, that is data quality may be degraded and a flash memory controller needs to use a complicated decoding method such as soft decoding method or RAID (Redundant Array of Independent Disks) data recovery to obtain the data, thus increasing the reading time. To avoid this retention issue, the flash memory controller needs to scan many blocks periodically to determine if any block suffers the data retention issue. However, if too many blocks are scanned, a system performance may be seriously degraded; and if only a few of blocks are scanned, some blocks having data retention issue may not be found. Therefore, how to provide a scanning method for efficiently determining the blocks having data retention issue is an important topic.

SUMMARY OF THE INVENTION

It is therefore an objective of the present invention to provide a method for managing a flash memory module, which groups the blocks in the flash memory module, for the flash memory module to scan the blocks efficiently, to solve the above-mentioned problems.

According to one embodiment of the present invention, a method for managing a flash memory module includes the steps of: grouping a plurality of blocks within the flash memory module into a plurality of groups; scanning a target block of each group, without scanning all of the blocks within the group, to determine if at least a portion of blocks of the group needs to be refreshed, wherein the group that is determined that at least the portion of blocks needs to be refreshed is marked as a marked group; only scanning at least the portion of blocks of the marked group, without scanning the groups that is not marked, to determine which block needs to be refreshed, wherein the block that is determined to be refreshed is marked as a marked block; refreshing the marked block(s) by moving valid data of the marked block(s) to at least one blank block.

According to another embodiment of the present invention, a flash memory controller having a memory and a microprocessor is disclosed, wherein the memory stores a program code, and the microprocessor executes the program code to access the flash memory module. During operation of the flash memory module, the microprocessor groups a plurality of blocks within the flash memory module into a plurality of groups, wherein each group comprises at least one block; the microprocessor scans a target block of each group, without scanning all of the blocks within the group, to determine if at least a portion of blocks of the group needs to be refreshed, wherein the group that is determined that at least the portion of blocks needs to be refreshed is marked as a marked group; the microprocessor only scans at least the portion of blocks of the marked group, without scanning the groups that is not marked, to determine which block needs to be refreshed, wherein the block that is determined to be refreshed is marked as a marked block; and the microprocessor refreshes the marked block(s) by moving valid data of the marked block(s) to at least one blank block.

According to another embodiment of the present invention, a memory device comprising a flash memory module and a flash memory controller is disclosed. In the operation of the memory device, the flash memory controller groups a plurality of blocks within the flash memory module into a plurality of groups, wherein each group comprises at least one block; the flash memory controller scans a target block of each group, without scanning all of the blocks within the group, to determine if at least a portion of blocks of the group needs to be refreshed, wherein the group that is determined that at least the portion of blocks needs to be refreshed is marked as a marked group; the flash memory controller only scans at least the portion of blocks of the marked group, without scanning the groups that is not marked, to determine which block needs to be refreshed, wherein the block that is determined to be refreshed is marked as a marked block; and the flash memory controller refreshes the marked block(s) by moving valid data of the marked block(s) to at least one blank block.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
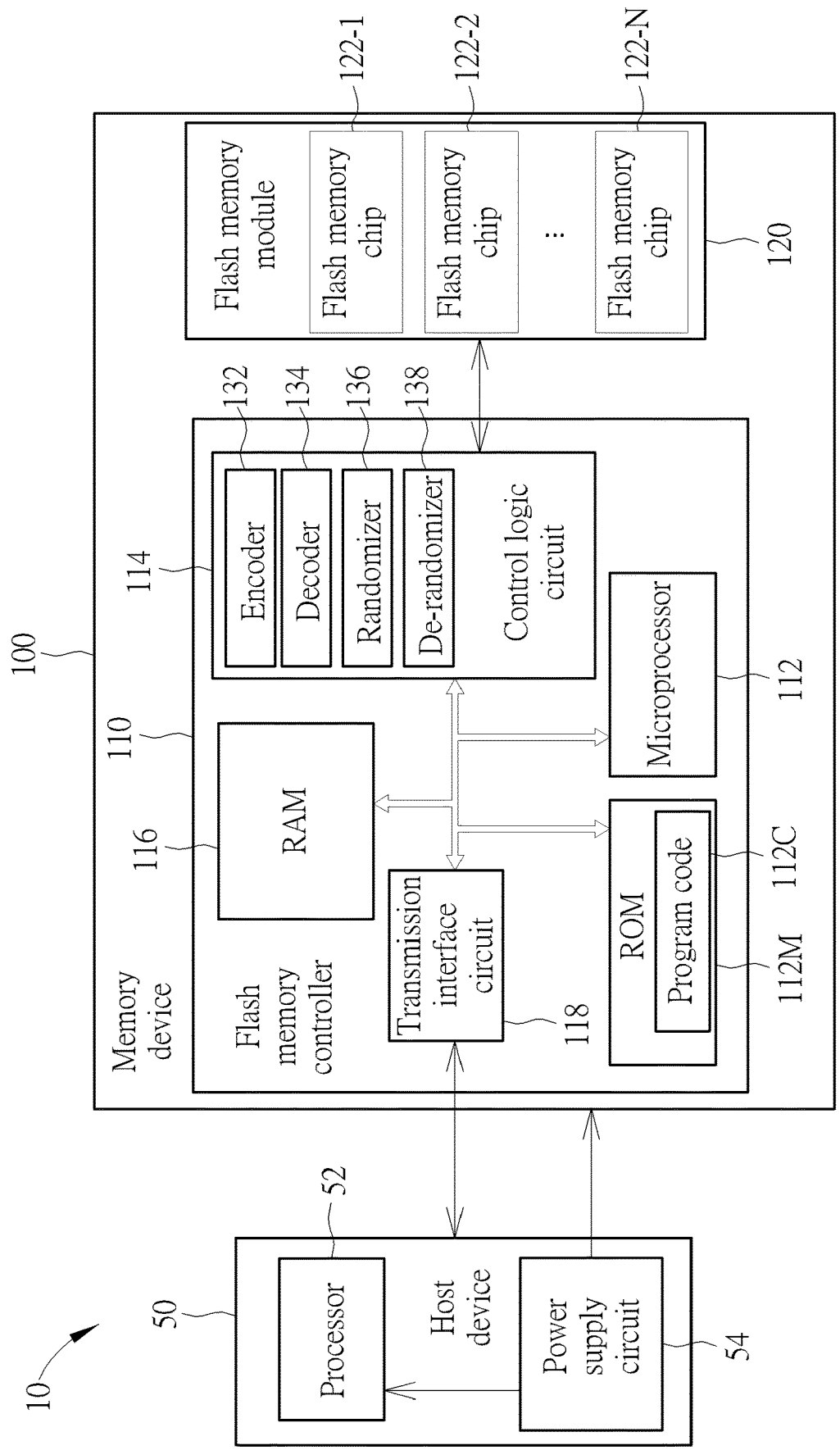
FIG. 1 is a diagram of an electronic device according to an embodiment of the present invention.

FIG. 1 is a diagram of an electronic device 10 according to an embodiment of the present invention, where the electronic device 10 may comprise a host device 50 and a memory device 100. The host device 50 may comprise at least one processor (e.g. one or more processors) which may be collectively referred to as the processor 52, and may further comprise a power supply circuit 54 coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. Examples of the host device 50 may include, but are not limited to: a multifunctional mobile phone, a wearable device, a tablet computer, and a personal computer such as a desktop computer and a laptop computer. Examples of the memory device 100 may include, but are not limited to: a solid state drive (SSD), and various types of embedded memory devices such as that conforming to Peripheral Component Interconnect Express (PCIe) specification, etc. According to this embodiment, the memory device 100 may comprise a flash memory controller 110, and may further comprise a flash memory module 120, where the flash controller 110 is arranged to control operations of the memory device 100 and access the flash memory module 120, and the flash memory module 120 is arranged to store information. The flash memory module 120 may comprise at least one flash memory chip such as a plurality of flash memory chips 122-1, 122-2, . . . , and 122-N, where "N" may represent a positive integer that is greater than one.

As shown in FIG. 1, the flash memory controller 110 may comprise a processing circuit such as a microprocessor 112, a storage unit such as a read-only memory (ROM) 112M, a control logic circuit 114, a RAM 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the ROM 112M of this embodiment is arranged to store a program code 112C, and the microprocessor 112 is arranged to execute the program code 112C to control the access of the flash memory module 120. Note that, in some examples, the program code 112C may be stored in the RAM 116 or any type of memory. Further, the control logic circuit 114 may be arranged to control the flash memory module 120, and may comprise an encoder 132, a decoder 134, a randomizer 136, a de-randomizer 138 and other circuits. The transmission interface circuit 118 may conform to a specific communications specification (e.g. Serial Advanced Technology Attachment (Serial ATA, or SATA) specification, Peripheral Component Interconnect (PCI) specification, Peripheral Component Interconnect Express (PCIe) specification, UFS specification, etc.), and may perform communications according to the specific communications specification, for example, perform communications with the host device 50 for the memory device 100, where the host device 50 may comprise the corresponding transmission interface circuit conforming to the specific communications specification, for performing communications with the memory device 100 for the host device 50.

In this embodiment, the host device 50 may transmit host commands and corresponding logical addresses to the memory controller 110 to access the memory device 100. The memory controller 110 receives the host commands and the logical addresses, and translates the host commands into memory operating commands (which may be simply referred to as operating commands), and further controls the flash memory module 120 with the operating commands to perform reading, writing/programing, etc. on memory units (e.g. data pages) having physical addresses within the flash memory module 120, where the physical addresses correspond to the logical addresses. When the flash memory controller 110 perform an erase operation on any flash memory chip 122-$n$ of the plurality of NV memory elements 122-1, 122-2, . . . , and 122-N (in which "n" may represent any integer in the interval [1, N]), at least one block of multiple blocks of the flash memory chip 122-$n$ may be erased, where each block of the blocks may comprise multiple pages (e.g. data pages), and an access operation (e.g. reading or writing) may be performed on one or more pages.

Figure 2:
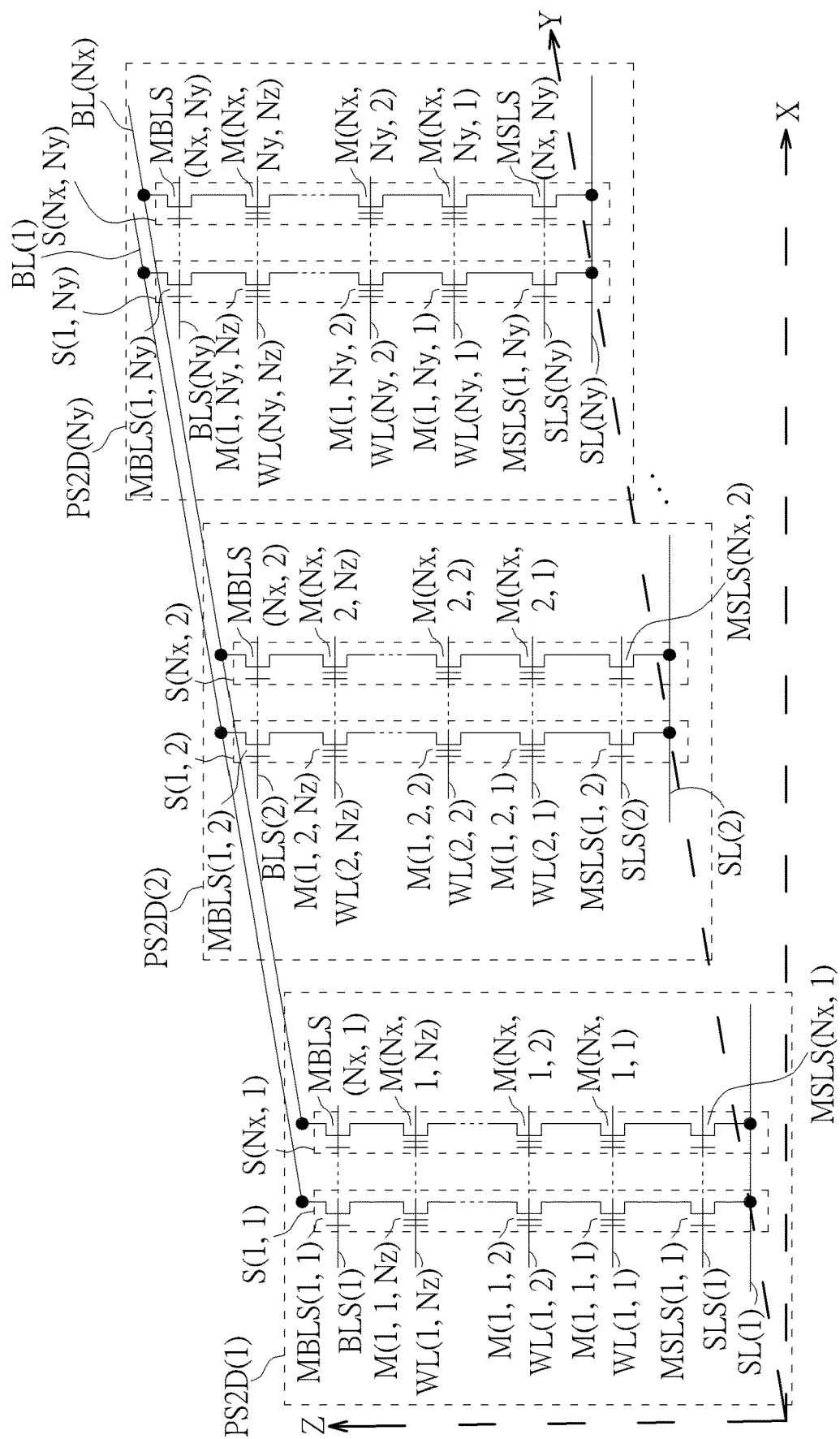
FIG. 2 is a diagram of a three-dimensional (3D) NAND flash memory module according to an embodiment of the present invention.

FIG. 2 is a diagram of a three-dimensional (3D) NAND flash memory module according to an embodiment of the present invention. For example, any memory element within the aforementioned at least one of the flash memory chips 122-1, 122-2, . . . , and 122-N, may be implemented based on the 3D NAND flash memory shown in FIG. 2, but the present invention is not limited thereto.

According to this embodiment, the 3D NAND flash memory may comprise a plurality of memory cells arranged in a 3D structure, such as (Nx*Ny*Nz) memory cells {{M(1, 1, 1), . . . , M(Nx, 1, 1)}, {M(1, 2, 1), . . . , M(Nx, 2, 1)}, . . . , {M(1, Ny, 1), . . . , M(Nx, Ny, 1)}}, {{M(1, 1, 2), . . . , M(Nx, 1, 2)}, {M(1, 2, 2), . . . , M(Nx, 2, 2)}, . . . , {M(1, Ny, 2), . . . , M(Nx, Ny, 2)}}, . . . , and {{M(1, 1, Nz), . . . , M(Nx, 1, Nz)}, {M(1, 2, Nz), . . . , M(Nx, 2, Nz)}, . . . , {M(1, Ny, Nz), . . . , M(Nx, Ny, Nz)}} that are respectively arranged in Nz layers perpendicular to the Z-axis and aligned in three directions respectively corresponding to the X-axis, the Y-axis, and the Z-axis, and may further comprise a plurality of selector circuits for selection control, such as (Nx*Ny) upper selector circuits {MBLS(1, 1), . . . , MBLS(Nx, 1)}, {MBLS(1, 2), . . . , MBLS(Nx, 2)}, . . . , and {MBLS(1, Ny), . . . , MBLS(Nx, Ny)} that are arranged in an upper layer above the Nz layers and (Nx*Ny) lower selector circuits {MSLS(1, 1), . . . , MSLS(Nx, 1)}, {MSLS(1, 2), . . . , MSLS(Nx, 2)}, . . . , and {MSLS(1, Ny), . . . , MSLS(Nx, Ny)} that are arranged in a lower layer below the Nz layers. In addition, the 3D NAND flash memory may comprise a plurality of bit lines and a plurality of word lines for access control, such as Nx bit lines BL(1), . . . , and BL(Nx) that are arranged in a top layer above the upper layer and (Ny*Nz) word lines {WL(1, 1), WL(2, 1), . . . , WL(Ny, 1)}, {WL(1, 2), WL(2, 2), . . . , WL(Ny, 2)}, . . . , and {WL(1, Nz), WL(2, Nz), . . . , WL(Ny, Nz)} that are respectively arranged in the Nz layers. Additionally, the 3D NAND flash memory may comprise a plurality of selection lines for selection control, such as Ny upper selection lines BLS(1), BLS(2), . . . , and BLS(Ny) that are arranged in the upper layer and Ny lower selection lines SLS(1), SLS(2), . . . , and SLS(Ny) that are arranged in the lower layer, and may further comprise a plurality of source lines for providing reference levels, such as Ny source lines SL(1), SL(2), . . . , and SL(Ny) that are arranged in a bottom layer below the lower layer.

As shown in FIG. 2, the 3D NAND flash memory may be divided into Ny circuit modules PS2D(1), PS2D(2), . . . , and PS2D(Ny) distributed along the Y-axis. For better comprehension, the circuit modules PS2D(1), PS2D(2), . . . , and PS2D(Ny) may have some electrical characteristics similar to that of a planar NAND flash memory having memory cells arranged in a single layer, and therefore may be regarded as pseudo-2D circuit modules, respectively, but the present invention is not limited thereto. In addition, any circuit module PS2D(ny) of the circuit modules PS2D(1), PS2D(2), . . . , and PS2D(Ny) may comprise Nx secondary circuit modules S(1, ny), . . . , and S(Nx, ny), where "ny" may represent any integer in the interval [1, Ny]. For example, the circuit module PS2D(1) may comprise Nx secondary circuit modules S(1, 1), . . . , and S(Nx, 1), the circuit module PS2D(2) may comprise Nx secondary circuit modules S(1, 2), . . . , and S(Nx, 2), . . . , and the circuit module PS2D(Ny) may comprise Nx secondary circuit modules S(1, Ny), . . . , and S(Nx, Ny). In the circuit module PS2D(ny), any secondary circuit module S(nx, ny) of the secondary circuit modules S(1, ny), . . . , and S(Nx, ny) may comprise Nz memory cells M(nx, ny, 1), M(nx, ny, 2), . . . , and M(nx, ny, Nz), and may comprise a set of selector circuits corresponding to the memory cells M(nx, ny, 1), M(nx, ny, 2), . . . , and M(nx, ny, Nz), such as the upper selector circuit MBLS(nx, ny) and the lower selector circuit MSLS(nx, ny), where "nx" may represent any integer in the interval [1, Nx]. The upper selector circuit MBLS(nx, ny) and the lower selector circuit MSLS(nx, ny) and the memory cells M(nx, ny, 1), M(nx, ny, 2), . . . , and M(nx, ny, Nz) may be implemented with transistors. For example, the upper selector circuit MBLS(nx, ny) and the lower selector circuit MSLS(nx, ny) may be implemented with ordinary transistors without any floating gate, and any memory cell M(nx, ny, nz) of the memory cells M(nx, ny, 1), M(nx, ny, 2), . . . , and M(nx, ny, Nz) may be implemented with a floating gate transistor, where "nz" may represent any integer in the interval [1, Nz], but the present invention is not limited thereto. Further, the upper selector circuits MBLS(1, ny), . . . , and MBLS(Nx, ny) in the circuit module PS2D(ny) may perform selection according to the selection signal on the corresponding selection line BLS(ny), and the lower selector circuits MSLS(1, ny), . . . , and MSLS(Nx, ny) in the circuit module PS2D(ny) may perform selection according to the selection signal on the corresponding selection line SLS(ny).

In the flash memory module 120, when the block of any one of the flash memory chips 122-1-122-N serves as a single-level cell (SLC) block, each of the physical pages within the block correspond to one logical page, that is each of the memory cells of the page is configured to store only one bit, wherein one physical page may comprise all of the transistors controlled by a word line(e.g. the memory cells M(1, 1, Nz)-M(Nx, 1, Nz) corresponding to the word line WL(1, Nz) form a physical page). When the block of any one of the flash memory chips 122-1-122-N serves as an multiple-level cell (MLC) block, each of the physical pages within the block correspond to two logical pages, that is each of the memory cells of the page is configured to store two bits. When the block of any one of the flash memory chips 122-1-122-N serves as a triple-level cell (TLC) block, each of the physical pages within the block correspond to three logical pages, that is each of the memory cells of the page is configured to store three bits. When the block of any one of the flash memory chips 122-1-122-N serves as a quad-level cell (QLC) block, each of the physical pages within the block correspond to four logical pages, that is each of the memory cells of the page is configured to store four bits.

Figure 3:
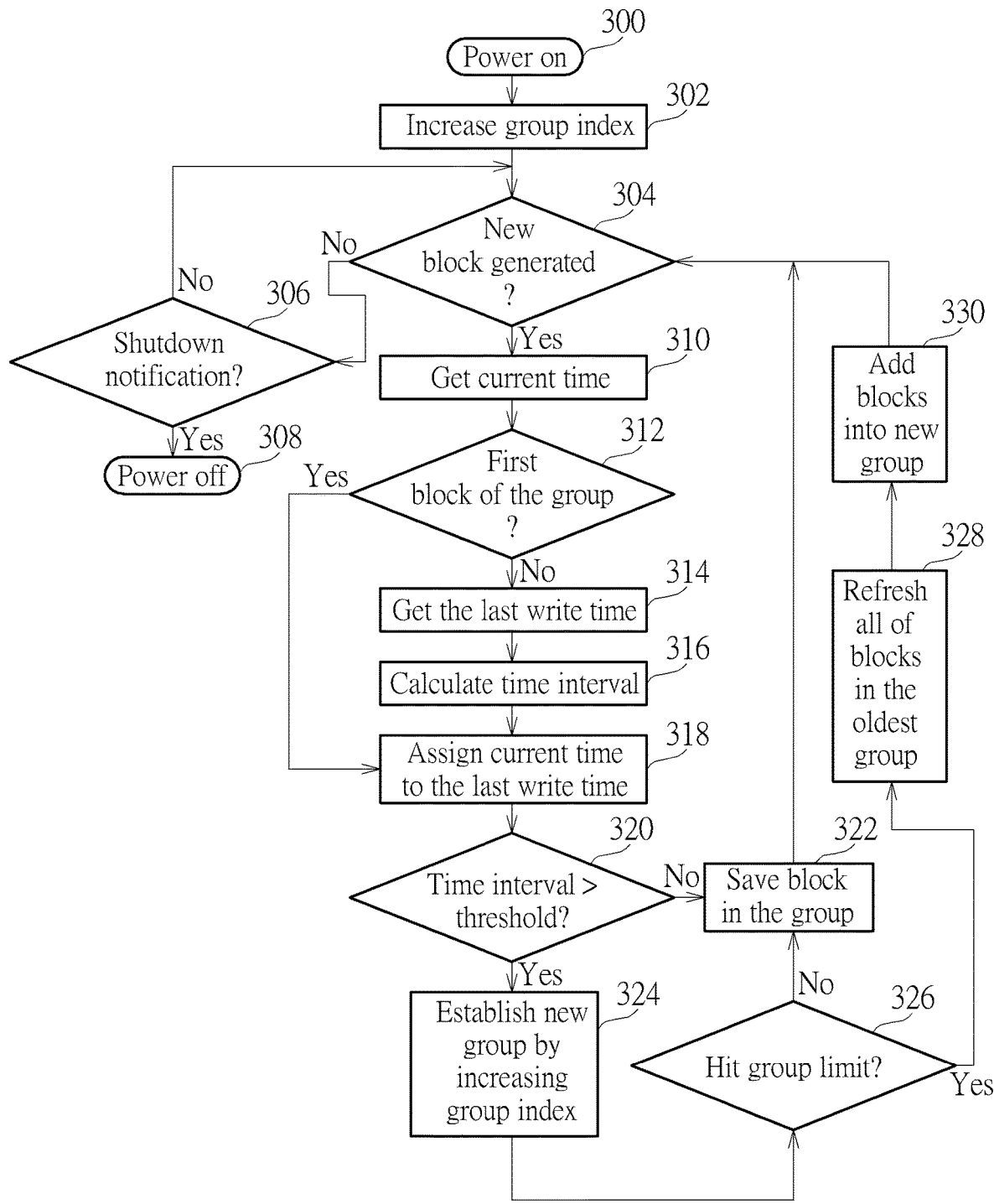
FIG. 3 is a flowchart of a method for managing the flash memory module when the flash memory controller writes data into the blocks of the flash memory module.

FIG. 3 is a flowchart of a method for managing the flash memory module 120 when the flash memory controller 110 writes data into the blocks of the flash memory module 120. In Step 300, the flow starts, and the flash memory controller 110 and the flash memory module 120 are powered on from a power-off state. In Step 302, the flash memory controller 302 starts to establish a new group, where the new group has a group index that is a previous group index plus one. For example, if the flash memory controller 110 has established ten groups before and the latest group has the group index "10", the group index of this new group is "11". In Step 304, it is determined if the microprocessor 112 generates a new block (blank block) for storing data, if any new block is generated, the flow enters Step 310; and if no new block is generated, the flow enters Step 306. In Step 306, it is determined if the flash memory microprocessor 112 receives a shutdown notification from the host device 50, if yes, the flow enters Step 308 and the flash memory controller 110 and the flash memory module 120 are powered off; if not, the flow enters Step 304.

In Step 310, the microprocessor 112 gets a current time, wherein the current time may be obtained from the host device 50 (e.g. 2020/Jul./21, 15:00). In Step 312, the processor 312 determines if the new block generated in Step 304 is the first block of this group, if yes, the flow enters Step 318; if not, the flow enters Step 314. In Step 314, the microprocessor 112 gets the last write time (i.e. the latest write time of the block in this group). In Step 316, the microprocessor 112 calculates a time interval between the current time and the last write time. In Step 318, the microprocessor 112 assigns the current time to be the last write time.

In Step 320, the microprocessor 112 determines if the time interval is greater than a threshold, if yes, the flow enters Step 324; if not, the flow enters Step 322. In Step 322, the microprocessor 112 adds the new block generated in Step 304 into the group established in the Step 302, then the flow goes back to Step 304. In Step 324, the processor 324, the microprocessor 112 establishes a new group, where the new group has a group index that is a previous group index plus one. In detail, if the microprocessor 112 establishes the group having the group index "11" in Step 302, the microprocessor 112 may establish the new group having the group index "12" in Step 324.

In Step 326, the microprocessor 112 determines if the group index hits a group limit, if yes, the flow enters Step 328; and if not, the flow enters Step 322. For example, assuming that the group limit is "50", that is the processor can only establish fifty groups, the microprocessor 112 determines if the new group established in Step 324 has the group index "50".

In Step 328, the microprocessor 112 refreshes the blocks belonging to some of the old groups. For example, the microprocessor 112 may selects the oldest five groups (i.e. having the earliest write time), and the microprocessor 112 moves the blocks belonging to the oldest five groups into new blocks, and adding these new blocks into the group index "50" (Step 330). After the blocks are refreshed in the Steps 328 and 330, the microprocessor 112 may re-arrange the group indexes, for example, the group having the group index "5" is modified to have the group index "1", the group having the group index "6" is modified to have the group index "2", and so on.

After Step 322 or Step 330, the block established in Step 304 is used to store data provided by the flash memory controller 110. Once all of the pages within the block are written, the microprocessor 112 arranges a new block for storing subsequent data, and the flow restarts from Step 310.

Figure 4:
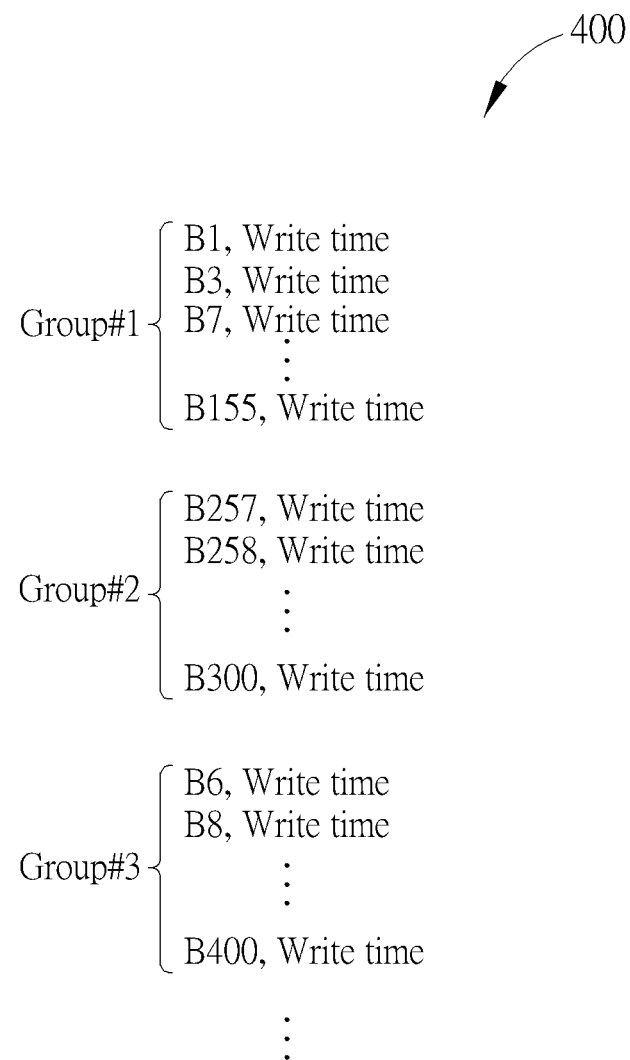
FIG. 4 shows a table recording the group according to one embodiment of the present invention.

During the group establishment in the flow shown in FIG. 3, the group information and the time information may be recorded in a table stored in the RAM 116 or an external dynamic random access memory (DRAM). FIG. 4 shows a table 400 recording the group according to one embodiment of the present invention. As shown in FIG. 4, the table 400 comprises many groups, wherein the group #1 comprises blocks B1, B3, B7, . . . , B155 and corresponding write times, the group #2 comprises blocks B257, B258, . . . , B300 and corresponding write times, and the group #3 comprises blocks B6, B8, . . . , B400 and corresponding write times. It is noted that, the write times of the blocks belonging to the group having the smaller group index are earlier than the write times of the blocks belonging to the group having the larger group index. For example, the write time of each of the blocks B1, B3, B7, . . . , B155 in the group #1 is earlier than each of the write time of the blocks B257, B258, ..., B300 in the group #2, and the write time of each of the blocks B257, B258, ..., B300 in the group group #2 is earlier than the write time of each of the blocks B6, B8, ..., B400 in the group #3. In addition, in each of the groups, the recorded blocks are sorted according the write times, for example, the block B1 having the earliest write time among the blocks in the group #1 is arranged to have an index "1" of the group #1, the block B257 having the earliest write time among the blocks in the group #2 is arranged to have an index "1" of the group #2, and the block B6 having the earliest write time among the blocks in the group #3 is arranged to have an index "1" of the group #3.

In addition, all of the blocks belonging to the same group may be the same type of block, or the blocks belonging to the same group may comprise different types of blocks. For example, each of the blocks B1, B3, B7, ..., B155 belonging to the group #1 may be a TLC block (or QLC block); or the blocks B1, B3, B7, ..., B155 belonging to the group #1 may comprise TLC/QLC block(s) and SLC block(s).

Figure 5:
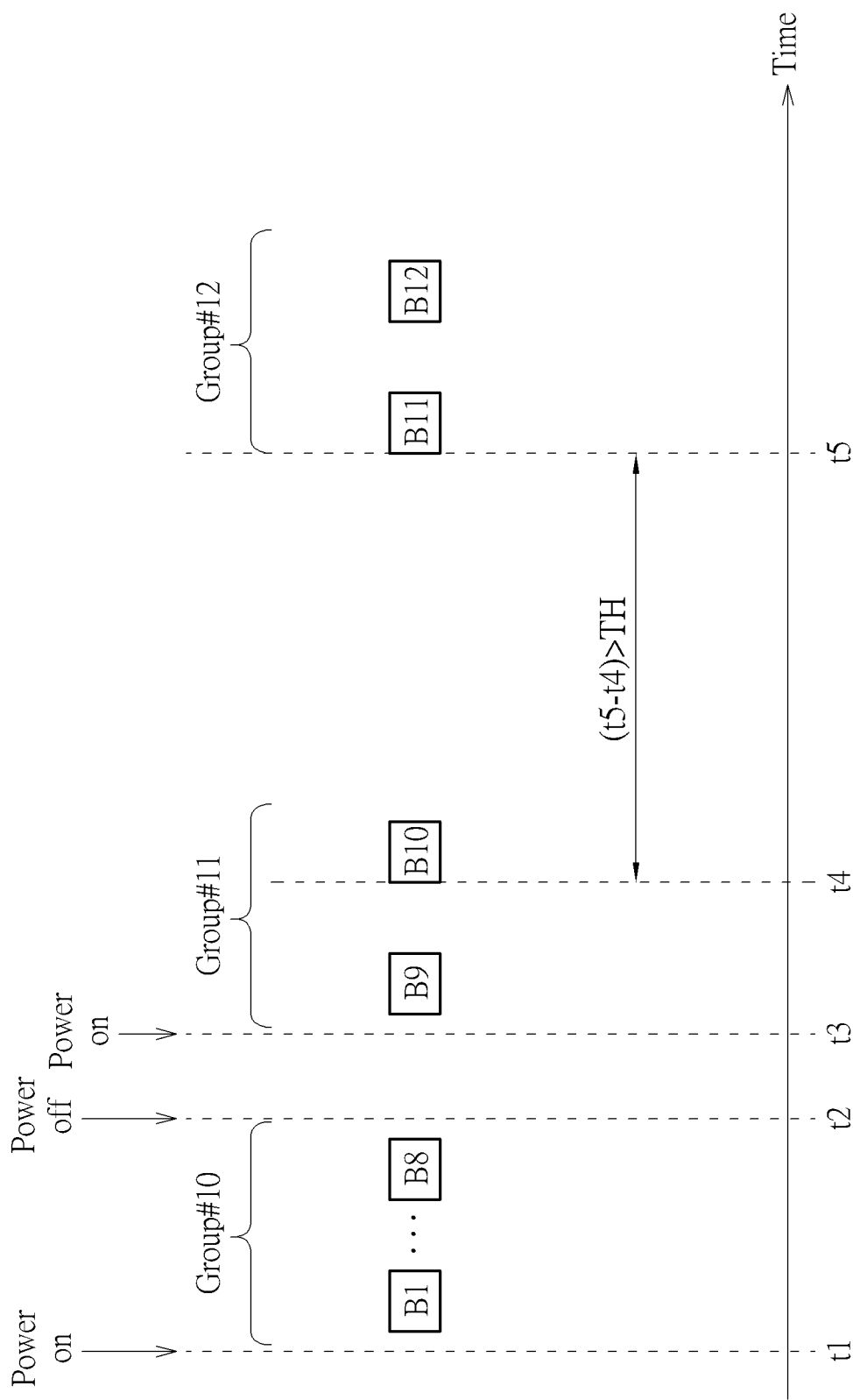
FIG. 5 shows a timing diagram of grouping the blocks according to one embodiment of the present invention.

In the embodiment shown in FIG. 3, the blocks belonging to the same group can be considered to have close write times, and the grouping method of this embodiment can be used for efficiently detecting the data retention issue of the blocks within the flash memory module 120. In order to make sure that the blocks belonging to the same group have close write times, different power cycles must belong to different groups, wherein a power cycle indicates a period from a power-on event to a power-off event; and a new group is established when a new block whose write time is much later than the write time of the previous block. Specifically, referring to FIG. 5, at time t1, the flash memory controller 110 and the flash memory module 120 are powered on, the microprocessor 112 of the flash memory controller 110 establishes the group #10, and the flash memory controller 110 sequentially writes data into the blocks B1-B8 that belongs to the group #10. Then, at time t2, the flash memory controller 110 receives the shutdown notification from the host device 50, and the flash memory controller 110 and the flash memory module 120 are powered off. At time t3, the flash memory controller 110 and the flash memory module 120 are powered on from the power-off state, the microprocessor 112 of the flash memory controller 110 establishes the group #11, and the flash memory controller 110 sequentially writes data into the blocks B9 and B10 that belongs to the group #11. In this embodiments, it is assumed that the flash memory controller 110 starts to write data into the block B10 at time t4, and the flash memory controller 110 has not created a new block for a long time (e.g. the flash memory controller 110 slowly write data into the block B10). Then, the flash memory controller 110 creates a block B11 for storing data at time t5, if a time interval between times t5 and t4 is greater than a threshold TH, the microprocessor 112 establishes a new group #12, and the flash memory controller 110 sequentially writes data into the blocks B11 and B12 that belongs to the group #12. In this embodiment, the threshold TH may be determined by an engineer based on an application or quality of flash memory module 120, for example, the threshold TH may be a day, several days or a week.

Figure 6:
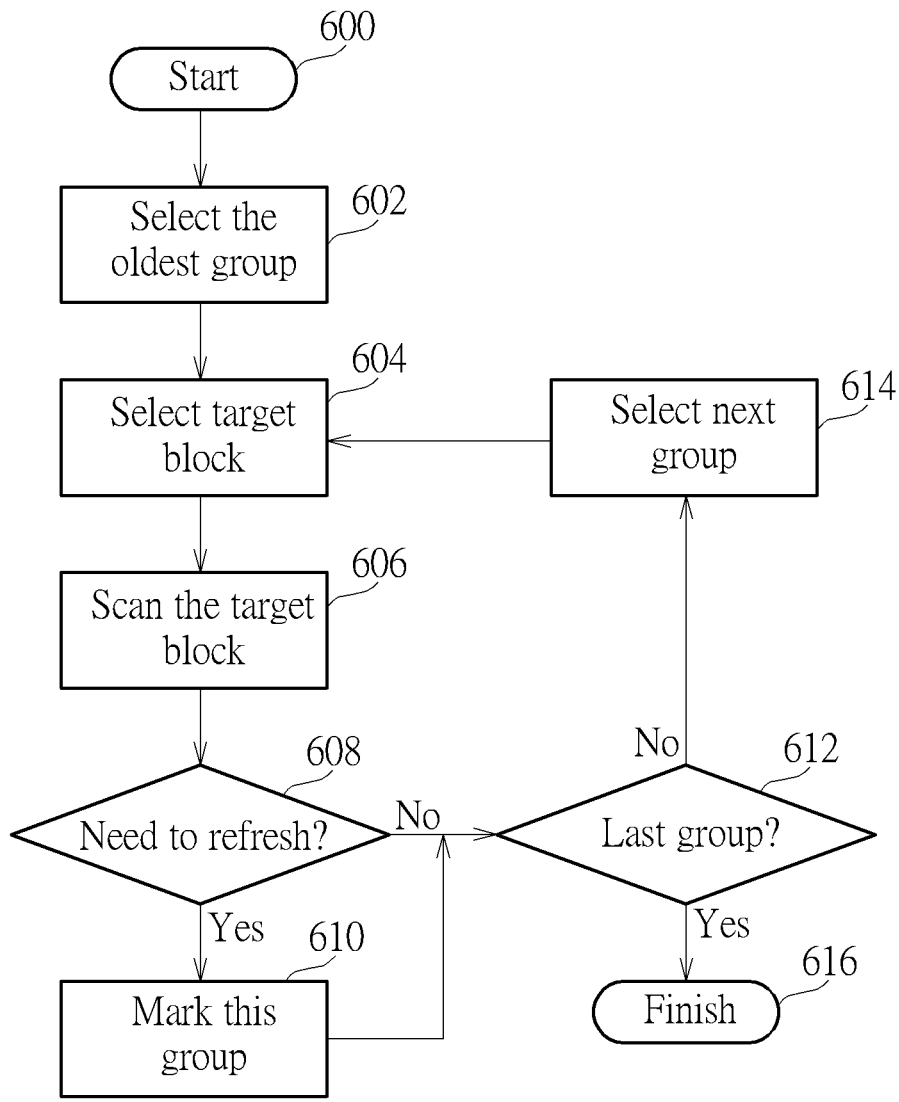
FIG. 6 is a flowchart of a method for managing the flash memory module according to another embodiment of the present invention.

FIG. 6 is a flowchart of a method for managing the flash memory module 120 according to another embodiment of the present invention. In Step 600, the flow starts, and the table recording the group information has been stored in the RAM 116 or the external DRAM. In Step 602, the microprocessor 112 refers to the table to select the oldest group. Taking FIG. 4 as an example, the group #1 having the earliest write time is selected as the oldest table. In Step 604, the microprocessor 112 selects a target block of the selected group, wherein the target block may be the oldest block having the earliest write time among the blocks belonging to the selected group, or the target block may be the oldest block having the earliest write time among specific blocks belonging to the selected group. For example, if all of the blocks belonging to the selected group are the same type of blocks, such as TLC blocks, the microprocessor 112 can directly select the oldest block (i.e. having the earliest write time) within the selected group as the target block. If the blocks belonging to the selected group comprise different types of blocks, such as TLC/QLC block(s) and SLC block(s), the microprocessor 112 can select the oldest TLC block or QLC block as the target block even if the write time(s) of one or more SLC blocks is/are earliest than the write time of the oldest TLC/QLC block, because the SLC block is robust to the data retention issue.

In Step 606, the microprocessor 112 scans the target block to determine quality of the target block. Specifically, the microprocessor 112 may read one or more pages of the target block by using the decoder 134, and microprocessor 112 may refer to decoding information provided by the decoder 134 to determine the quality of the target block, wherein the decoding information may be an error bit number, threshold voltage shifting information or any other indicator that can show the quality of the target block.

In Step 608, the microprocessor 112 determines if the target block needs to be refreshed based on the quality of the target bock. If the quality is good enough, the microprocessor 112 determines that the target block does not need to be refreshed, and the flow enters Step 612; and if the quality is not good enough, the microprocessor 112 determines that the target block needs to be refreshed, and the flow enters Step 610.

In Step 610, the microprocessor 112 marks the selected group. In Step 612, the microprocessor 112 does not mark the selected group, and the microprocessor 112 determines that if the selected group is the last group recording in the table 400, if yes, the flow enters Step 616 to finish the flow; and if not, the flow enters Step 614 to select the next group (e.g. group #2 shown in FIG. 4).

In the embodiment shown in FIG. 4, because the blocks belonging to the same group have close write times, so only the target block (e.g. oldest block) within each group is scanned by the microprocessor 112 to determine if the group has the quality issue, and other blocks within the group are not scanned to avoid affecting the system performance.

In addition, because the blocks belonging to different groups may be written under different environment such as different temperatures, the blocks belonging to later group may have worse quality than the blocks belonging to the earlier group. For example, if the blocks belonging to the group #2 are written under higher temperature, the quality of these blocks may be worse than the quality of the blocks belonging to the group #1. Therefore, the flow shown in FIG. 6 needs to scan the target block of every group.

Figure 7:
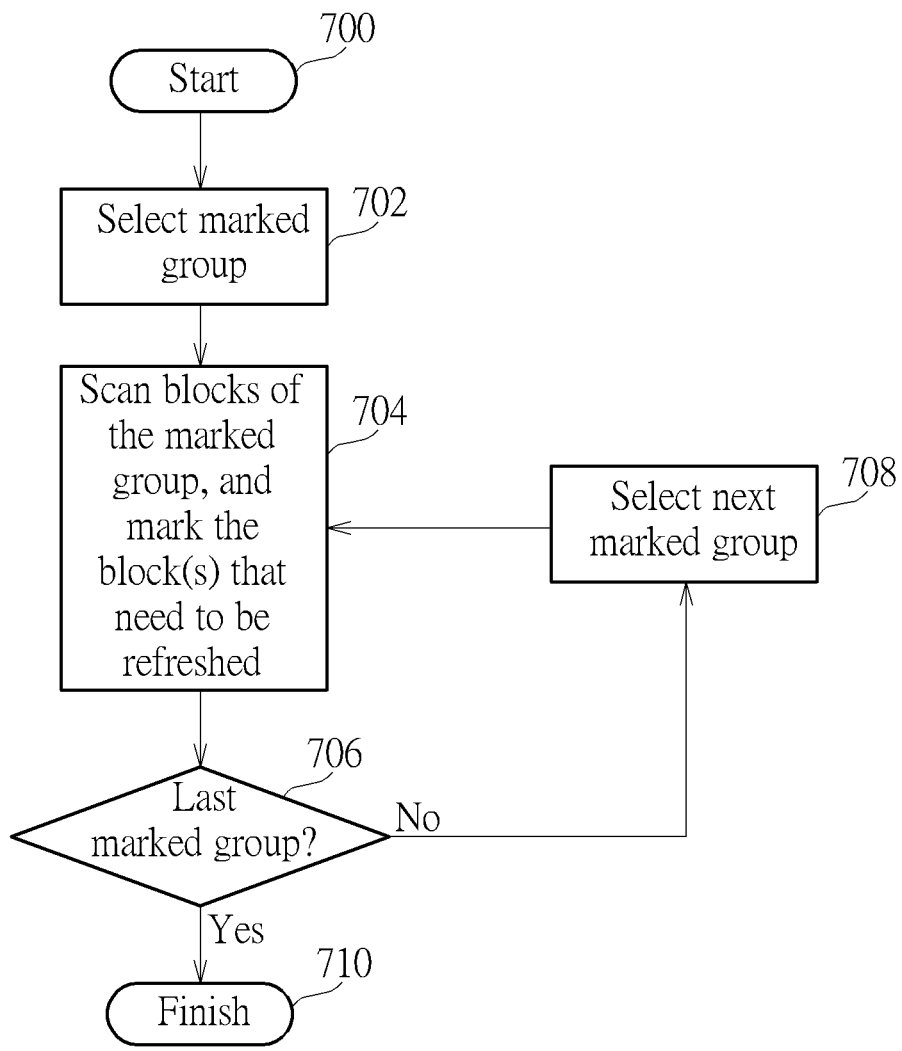
FIG. 7 is a flowchart of a method for managing the flash memory module according to another embodiment of the present invention.

The flow shown in FIG. 6 is used to determine the group whose blocks having worse quality, where the group(s) is/are marked for the following detailed scanning procedure shown in FIG. 7, and the group(s) that is/are not marked does not need to perform the following detailed scanning procedure. FIG. 7 is a flowchart of a method for managing the flash memory module 120 according to another embodiment of the present invention. In Step 700, the flow starts, and one or more groups are marked in the flow shown in FIG. 6. In Step 702, the microprocessor 112 selects a marked group, for example, the group #1 shown in FIG. 4. In Step 704, the microprocessor 112 scans at least portion of the blocks belonging to the selected marked group, to determine which block needs to be refreshed. For example, the microprocessor 112 may scan all of the blocks belonging to the selected marked group, and the block(s) whose quality is worse than a degree is/are marked, where the marked block(s) is/are determined to be refreshed. In another example, the microprocessor 112 may use a binary search to scan a portion of the blocks belonging to the selected marked group, and the block(s) whose quality is worse than a degree is/are marked, where the marked block(s) is/are determined to be refreshed.

In Step 706, the microprocessor 112 determines if the selected marked group is the last marked group, if yes, the flow enters Step 710 to finish the flow; and if not, the flow enters Step 708 to select the next marked group (e.g. the group #2 shown in FIG. 4).

The marked blocks determined by the flow shown in FIG. 7 are refreshed to move valid data to other blocks in a background of the flash memory controller 110. For example, if the flash memory controller 110 is idle (i.e., not execute read/write operation), the microprocessor 112 can start to refresh these marked blocks.

Briefly summarized, in the method for managing the flash memory module of the present invention, the blocks are grouped while being written by the flash memory controller, the blocks belonging to the same group have close write time, and the microprocessor only needs to scan a few blocks to determine which blocks need to be refreshed. Therefore, because only a few blocks are scanned to determine which blocks need to be refreshed, the method of the present invention is efficient without influencing the system performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for managing a flash memory module, comprising:
    grouping a plurality of blocks within the flash memory module into a plurality of groups, wherein each group comprises at least one block;
    scanning a target block of each group, without scanning all of the blocks within the group, to determine if at least a portion of blocks of the group needs to be refreshed, wherein the group that is determined that at least the portion of blocks needs to be refreshed is marked as a marked group;
    only scanning at least the portion of blocks of the marked group, without scanning the groups that is not marked, to determine which block needs to be refreshed, wherein the block that is determined to be refreshed is marked as a marked block;
    refreshing the marked block(s) by moving valid data of the marked block(s) to at least one blank block;
    wherein the step of grouping a plurality of blocks within the flash memory module into the plurality of groups comprises:
        grouping the plurality of blocks according to power-on events and power-off events of a flash memory controller, to make that different power cycles correspond to different groups, wherein a power cycle indicates a period from one power-on event to a following power-off event;
    wherein the step of scanning the target block of each group comprises:
        selecting a specific block having earliest write time within the group as the target block.

2. The method of claim 1, wherein the plurality of blocks comprises a first group of blocks having a first type and a second group of blocks having a second type, and the step of scanning the target block of each group comprises:
    selecting a specific block among the blocks having the first type with the earliest write time as the target block.

3. The method of claim 2, wherein the blocks having the first type are triple-level cell (TLC) blocks or quad-level cell (QLC) blocks.

4. A flash memory controller, wherein the flash memory controller is coupled to a flash memory module, and the flash memory controller comprising:
    a memory, for storing a program code;
    a microprocessor, for executing the program code to access the flash memory module;
    wherein the microprocessor groups a plurality of blocks within the flash memory module into a plurality of groups, wherein each group comprises at least one block; the microprocessor scans a target block of each group, without scanning all of the blocks within the group, to determine if at least a portion of blocks of the group needs to be refreshed, wherein the group that is determined that at least the portion of blocks needs to be refreshed is marked as a marked group; the microprocessor only scans at least the portion of blocks of the marked group, without scanning the groups that is not marked, to determine which block needs to be refreshed, wherein the block that is determined to be refreshed is marked as a marked block; and the microprocessor refreshes the marked block(s) by moving valid data of the marked block(s) to at least one blank block;
    wherein the microprocessor groups the plurality of blocks according to write times of the blocks, to make that two blocks written in sequence whose write times having a time interval greater than a threshold correspond to different groups.

5. The flash memory controller of claim 4, wherein the microprocessor groups the plurality of blocks according to power-on events and power-off events of the flash memory controller, to make that different power cycles correspond to different groups, wherein a power cycle indicates a period from one power-on event to a following power-off event.

6. A flash memory controller, wherein the flash memory controller is coupled to a flash memory module, and the flash memory controller comprising:
    a memory, for storing a program code;
    a microprocessor, for executing the program code to access the flash memory module;
    wherein the microprocessor groups a plurality of blocks within the flash memory module into a plurality of groups, wherein each group comprises at least one block; the microprocessor scans a target block of each group, without scanning all of the blocks within the group, to determine if at least a portion of blocks of the group needs to be refreshed, wherein the group that is determined that at least the portion of blocks needs to be refreshed is marked as a marked group; the microprocessor only scans at least the portion of blocks of the marked group, without scanning the groups that is not marked, to determine which block needs to be refreshed, wherein the block that is determined to be refreshed is marked as a marked block; and the microprocessor refreshes the marked block(s) by moving valid data of the marked block(s) to at least one blank block;

wherein the microprocessor selects a specific block having earliest write time within the group as the target block.

7. The flash memory controller of claim 4, wherein the plurality of blocks comprises a first group of blocks having a first type and a second group of blocks having a second type, and the microprocessor selects a specific block among the blocks having the first type with the earliest write time as the target block.

8. The flash memory controller of claim 7, wherein the blocks having the first type are triple-level cell (TLC) blocks or quad-level cell (QLC) blocks.

9. A memory device, comprising:

a flash memory module; and a flash memory controller, configured to access the flash memory module;

wherein the flash memory controller groups a plurality of blocks within the flash memory module into a plurality of groups, wherein each group comprises at least one block; the flash memory controller scans a target block of each group, without scanning all of the blocks within the group, to determine if at least a portion of blocks of the group needs to be refreshed, wherein the group that is determined that at least the portion of blocks needs to be refreshed is marked as a marked group; the flash memory controller only scans at least the portion of blocks of the marked group, without scanning the groups that is not marked, to determine which block needs to be refreshed, wherein the block that is determined to be refreshed is marked as a marked block; and the flash memory controller refreshes the marked block(s) by moving valid data of the marked block(s) to at least one blank block;

wherein the plurality of blocks comprises a first group of blocks having a first type and a second group of blocks having a second type, and the flash memory controller selects a specific block among the blocks having the first type with the earliest write time as the target block.

10. The memory device of claim 9, wherein the flash memory controller groups the plurality of blocks according to power-on events and power-off events of the flash memory controller, to make that different power cycles correspond to different groups, wherein a power cycle indicates a period from one power-on event to a following power-off event.

11. The memory device of claim 9, wherein the flash memory controller groups the plurality of blocks according to write times of the blocks, to make that two blocks written in sequence whose write times having a time interval greater than a threshold correspond to different groups.

12. The memory device of claim 9, wherein the flash memory controller selects a specific block having earliest write time within the group as the target block.

13. The memory device of claim 9, wherein the blocks having the first type are triple-level cell (TLC) blocks or quad-level cell (QLC) blocks.

* * * * *